(12) United States Patent
Perrin et al.

(10) Patent No.: US 6,570,445 B1
(45) Date of Patent: May 27, 2003

(54) LINEARIZER FOR MICROWAVE AMPLIFIER

(75) Inventors: Olivier Perrin, Clamart (FR); Frédéric Andre, Clamart (FR)

(73) Assignee: Thales, Paris (FR)

( * ) Notice: Subject to any disclaimer, the term of this patent is extended or adjusted under 35 U.S.C. 154(b) by 0 days.

(21) Appl. No.: 10/019,276

(22) PCT Filed: Jul. 7, 2000

(86) PCT No.: PCT/FR00/01977

§ 371 (c)(1), (2), (4) Date: Jan. 2, 2002

(87) PCT Pub. No.: WO01/06642

PCT Pub. Date: Jan. 25, 2001

(30) Foreign Application Priority Data

Jul. 16, 1999 (FR) .............................. 99 09275

(51) Int. Cl.[7] .............................. H03F 1/30; H03F 3/60
(52) U.S. Cl. .......................... 330/149; 330/144; 330/53
(58) Field of Search .......................... 330/53, 144, 146, 330/149

(56) References Cited

U.S. PATENT DOCUMENTS

| | | | |
|---|---|---|---|
| 4,902,983 A | * | 2/1990 | Fujiki et al. ............ 330/149 |
| 5,038,113 A | * | 8/1991 | Katz et al. ............ 330/277 |
| 5,119,042 A | * | 6/1992 | Crampton et al. ......... 330/295 |
| 5,638,024 A | * | 6/1997 | Dent et al. ............ 330/84 |

OTHER PUBLICATIONS

"Power Amplifier for microwave digital radios with inherent phase compensation", IEE Proceedings H. Microwaves, Antennas, and Propagation, GB, Institute of Electrical Engineers, vol. 135, No. 5, Part H, Oct. 1, 1988, pp. 344–346.

P. Narozny et al., "Pseudomorphic ku–band gaas hfet lenearizer preamplifier front end for satellite twt–amplifiers", IEEE Gallum Arsenide Integrated Circuits (GAAS IC) Symposium, vol. SYMP 17, 1995, pp. 292–295.

* cited by examiner

Primary Examiner—Patricia T. Nguyen
(74) Attorney, Agent, or Firm—Oblon, Spivak, McClelland, Maier & Neustadt, P.C.

(57) ABSTRACT

A device for linearizing an RF or microwave signal output to an amplification stage including a traveling wave tube or a solid-state amplifier. A separator including a circulator and of a Schottky diode arrangement matched to the low-amplitude signals creates, for cheaper cost of components, of assemblage and of tuning, a compression path and an expansion path with excellent isolation performance and stability performance. Such a device may find particular application to telecommunications or to radar.

8 Claims, 2 Drawing Sheets

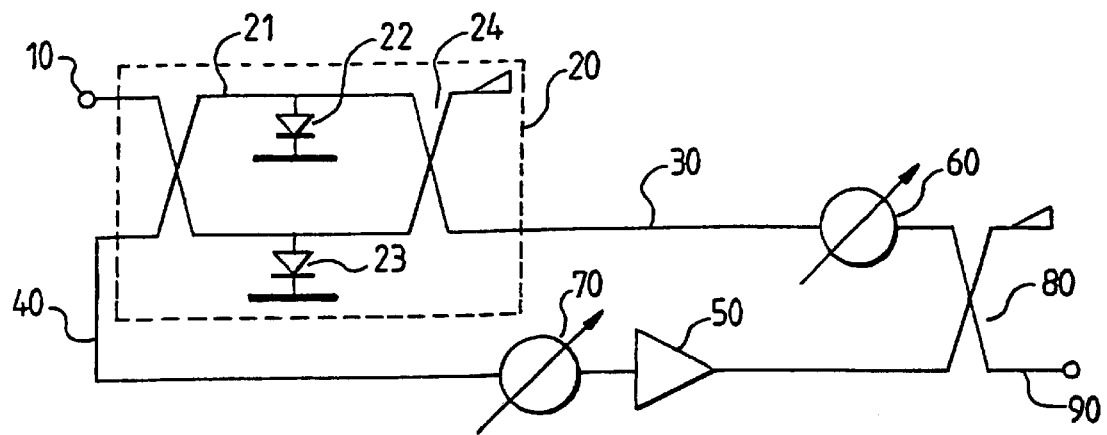
PRIOR ART  FIG.1
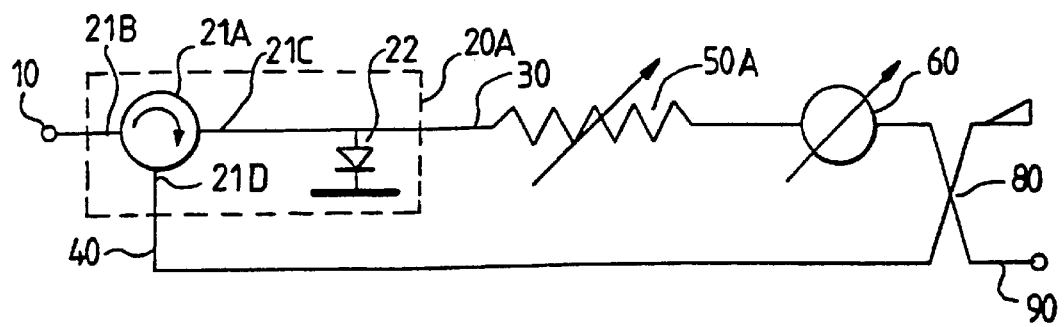
FIG.2

FIG.3
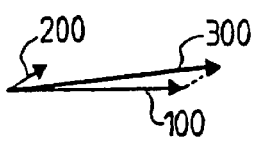
FIG.3.1
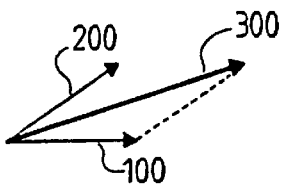
FIG.3.2
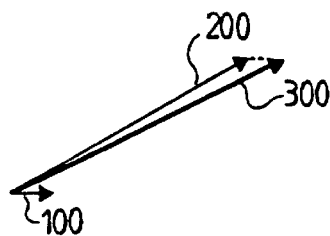
FIG.3.3
FIG.4
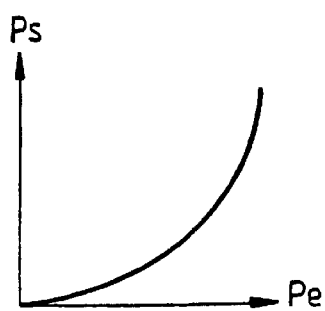
FIG.4.1
+
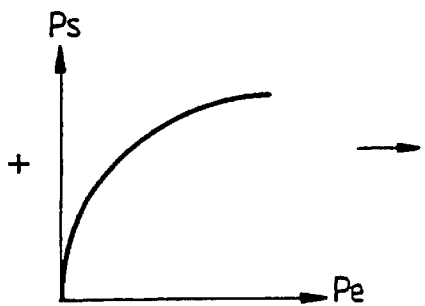
FIG.4.2
→
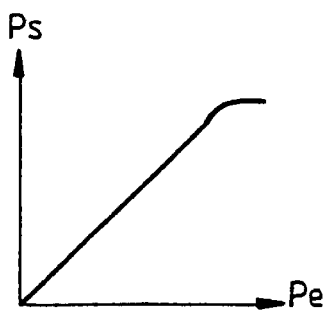
FIG.4.3

LINEARIZER FOR MICROWAVE AMPLIFIER

The present invention relates to RF and microwave amplifiers.

These amplifiers can be embodied in technology of the traveling wave tube type or in semiconductor technology. They apply in particular to telecommunications or to radars.

An amplification stage taken in isolation necessarily has a gain which decreases onward of a certain input power, generally lower than the saturation power at which the amplification stage must operate in order to exhibit adequate efficiency. This results in distortions in the transmitted signal which themselves create intersymbol interference which is all the more problematic since the passband is used in a dense manner, this being the sought-after objective, in particular in telecommunications. Said distortions have the additional drawback of not being temperature-stable.

This is why devices are used to linearize a microwave amplification stage, their common objective being to correct the nonlinearities of the amplification stage in such a way as to ensure a constant gain at the amplification stage close to the saturation power and over the entire passband of said stage within a temperature range corresponding to the operating conditions of the equipment.

Three main types of linearizer devices are described in the state of the art.

The first type consists of feedback loop linearizer devices, in which the amplitude and phase parameters of the output signal from the amplification stage are measured so as to deduce therefrom the corrections to be applied to the input signal to obtain a linear output signal. (See in particular patents U.S. Pat. Nos. 4,291,277, 5,598,127, 5,422,598, 5,469,114, 5,524,285 and 5,722,056). Given the lag introduced by the feedback loop, these devices are not usable for passbands above 100 MHz.

The second type consists of open loop linearizer devices in which various digital processing techniques are applied to the amplitude, phase or pulse components of the signal so as to correct the distortions. (See in particular U.S. Pat. Nos. 5,760,646, 5,877,653 and 5,886,573). These devices presuppose recourse to complex digital signal processing techniques and the use of specific circuits matched to the waveform emitted. This path is not practical nowadays because of the limits of semiconductor technology for carrier frequencies above a few gigahertz.

The third type consists of predistortion linearizer devices in which the input signal is subjected before being introduced into the amplification stage to a gain distortion which increases with input power and which will compensate as precisely as possible for the symmetric distortion of the amplification stage.

The present invention belongs to this third type. (As do U.S. Pat. Nos. 4,878,030, 5,146,177, 5,291,148, 5,523,716, 5,576,660 and 5,736,898, the latter patent of Kohl et al constituting the reference state of the art of the present invention).

In Kohl et al, the basic diagram of which is illustrated in FIG. 1 hereinbelow, the input signal (10) is submitted to a separator (20) consisting of two identical Schottky diodes (22 and 23), arranged in parallel between two coupler circuits (21 and 24), the parameters of the diodes being chosen so that the separation device allows only the low-amplitude signals through to a so-called compression path (30), the high-amplitude signals being reflected toward another path, the so-called expansion path (40), connected to one of the branches of the input coupler so as to be presented to an amplifier (50), the compression path and the expansion path being recombined so as to be presented to the input of the amplification stage (90) by a combiner coupler (80). The paths 30 and 40 are furnished with phase control devices (60 and 70).

This device has the theoretical advantage of achieving automatic control of the phase of the reflected signal. Now, this theoretical advantage is difficult to obtain in practice because of the scatter in the manufacturing and operating parameters of the diodes. Moreover, when the separation device deviates from the balanced operating conditions obtained in the case of two identical diodes, the reflected signal will disturb the input signal with a reflection coefficient varying with input power.

An aim of the present invention is to correct these defects of the prior art.

For this purpose, the invention proposes a linearizer device for RF and microwave amplification stage of the type comprising an input, followed by a separator operating by level-dependent selective reflection, which forward-feeds a compression path, and by reflection an expansion path, while the outputs of these two paths are united by a combiner coupler so as to go to the amplification stage, characterized in that the separator comprises a circulator, whose input port is linked to the input of the device, in that a single level-dependent selective reflection arrangement is placed after the input/output port of the circulator, and followed by one of said paths, and in that the output port of the circulator is linked to the other path.

The device furthermore comprises on the compression path or on the expansion path a phase control circuit, adjusted as a function of a chosen phase compensation law, and an amplitude control circuit.

The device is also characterized by microwave line lengths on the compression and expansion paths which are substantially identical.

Finally the device can hinge around components operating in passive mode.

The invention will be better understood, and its various characteristics and advantages will emerge from the description which follows of an exemplary embodiment, and from its appended figures, in which:

FIG. 1, already described, shows a predistortion linearizer of the prior art;

FIG. 2, schematically shows an example of an embodiment of a predistortion linearizer according to the invention;

FIG. 3, schematically shows how the signals of the compression path and of the expansion path are recombined within the linearizer device according to the invention;

FIG. 4, schematically shows the profile, versus the power of the input signal, of the output power of the linearizer device according to the invention, of the output power of the amplification stage with no linearizer device and of the output power of the amplification stage furnished with the linearizer device according to the invention.

FIG. 2 shows an example of a linearizer device for microwave amplification stage according to the invention. As in the previous figure, the input signal (10) is presented to a separator (20A). This separator (20A) consists however of just two elements, a circulator (21A) and a Schottky diode arrangement (22), instead of four (21, 22, 23, 24) for the separator (20).

The Schottky diode arrangement is impedance-matched to the low-amplitude signals. The input power level to which the diode arrangement is matched is chosen as a function of the operating parameters of the linearizer amplification stage. For these low-power signals, the Schottky diode arrangement operates as a capacitor. The technique of matching, known to the person skilled in the art, consists in appending two inductors to this capacitor, the values of said inductors being chosen by solving the equations known to the person skilled in the art giving the equivalent impedance of this circuit. The inductors may consist only of wiring inductors.

For the signals whose amplitude is below the amplitude to which it is matched, the signal is transmitted to the compression path (30).

For the signals whose amplitude is above the amplitude to which it is matched, the Schottky diode arrangement operates in short-circuit mode and the signal is reflected toward the circulator (21A). The circulator comprises an input port (21B), an input/output port (21C) and an output port (21D). As is known to the person skilled in the art versed in microwave technology, the circulator ensures excellent isolation of the reflected signal and of the input signal. The signal is therefore transmitted to the expansion path (40) without distortion of the input signal.

An adjustable attenuation circuit (50A) is placed on the compression path. It may be replaced (or, in certain cases, supplemented) with an amplification circuit on the expansion path. Both cases involve amplifying the effects of the separation of the two paths.

An adjustable phase control circuit (60) will be placed either on the compression path or on the expansion path. This circuit makes it possible to adjust the phase variation as a function of the characteristics of the amplification stage. The adjustment may be made so as to produce a phase lead at the output of the device, this being chosen when the amplification stage is a traveling wave tube. It may be made so as to produce a phase lag at the output of the device, this being chosen when the amplification stage is a semiconductor device. If the variations in manufacture of these two circuits are small, the adjustment may be simulated for one and the same type of amplification stage and no factory tuning will be necessary.

The compression and expansion paths are thereafter recombined in a conventional coupler (80) and the output signal (90) is conducted to the amplification stage.

FIG. 3 illustrates, in Fresnel diagrams, the manner of recombination of the vectors representative of the signals produced on the compression and expansion paths for increasing levels of the input signal. This illustration corresponds to a phase lead. FIGS. 3.1, 3.2 and 3.3 respectively illustrate three cases of recombination into a signal (300) of the signals of the compression path (100) and of the expansion path (200). The level of the signal (200) increases with the input signal. The output signal (300) increases more than proportionally.

FIG. 4 illustrates the effect of the linearizer device on the signal at the input (FIG. 4.1) and on the signal at the output of the amplification stage (FIG. 4.3), the amplification stage being presumed to produce on a signal not submitted to a linearizer device the effect illustrated by FIG. 4.2. FIG. 4.1 shows an increasing gain ($P_s/P_e$) versus input power ($P_e$), FIG. 4.2 a decreasing gain and FIG. 4.3 a constant gain over an extensive range of input powers, corresponding to the operating conditions of the amplification stage.

The compression and expansion paths will be of substantially identical microwave lengths.

The components might not be energized and the device will then operate in purely passive mode.

The components are transferred by techniques known to the person skilled in the art versed in microelectronics technologies. The Schottky diode is transferred either in the form of a bare chip onto a microstrip circuit on thin-film or thick-film aluminum substrate depending on the frequency of use, or as a package by SMC (Surface Mounted Component) transfer onto a cheaper printed circuit.

In place of a Schottky diode, it would be possible to use another limiter component with nonlinear effect, such as a field effect transistor.

Although the invention is of especial interest at high frequencies beyond 5 GHz, such as 10 to 20 GHz, it may find application in other bands.

What is claimed is:

1. A linearizer device for RF or microwave amplification stage comprising:

an input, followed by a separator operating by level-dependent selective reflection, which forward-feeds a compression path, and by reflection an expansion path, while the outputs of these two paths are united by a combiner coupler so as to go to the amplification stage, wherein the separator comprises a circulator, with an input port linked to the input of the device, a single level-dependent selective reflection arrangement is placed after the input port of the circulator, and followed by one of said paths, and an output port of the circulator is linked to the other path.

2. The device as claimed in claim 1, wherein said single selective reflection arrangement is a limiter.

3. The device as claimed in claim 1, wherein said single level-dependent selective reflection arrangement is based on a shunt-mounted Schottky diode.

4. The device as claimed in claim 1, wherein one of the two paths comprises a phase control circuit, adjusted as a function of a chosen path compensation law.

5. The device as claimed in claim 1, wherein the compression path comprises an adjustable attenuator circuit.

6. The device as claimed in claim 1, wherein the expansion path comprises a variable-gain amplifier circuit.

7. The device as claimed in claim 1, wherein the compression path and expansion path have substantially identical RF line lengths.

8. The device as claimed in claim 1, wherein the device essentially hinges around passive components.

* * * * *